United States Patent
Klapper et al.

(10) Patent No.: US 9,547,044 B2
(45) Date of Patent: Jan. 17, 2017

(54) METHOD AND APPARATUS FOR THE MEASUREMENT OF A RESISTANCE OF A SWITCHING CONTACT OF AN ELECTRICAL CIRCUIT BREAKER

(71) Applicant: OMICRON Electronics GmbH, Klaus (AT)

(72) Inventors: Ulrich Klapper, Rankweil (AT); Wernich De Villiers, Dornbirn (AT); Reinhard Kaufmann, Thuringerberg (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 0 days.

(21) Appl. No.: 14/804,983

(22) Filed: Jul. 21, 2015

(65) Prior Publication Data

US 2015/0323604 A1 Nov. 12, 2015

Related U.S. Application Data

(62) Division of application No. 13/970,674, filed on Aug. 20, 2013.

(30) Foreign Application Priority Data

Aug. 24, 2012 (EP) .................................. 12006040

(51) Int. Cl.
*G01R 31/02* (2006.01)
*G01R 31/327* (2006.01)
(Continued)

(52) U.S. Cl.
CPC ........... *G01R 31/333* (2013.01); *G01R 27/205* (2013.01); *G01R 31/3274* (2013.01)

(58) Field of Classification Search
CPC .............. G01R 31/327; G01R 31/3274; G01R 31/3272; G01R 31/3271; G01R 31/333; G01R 31/02; G01R 31/3278; G01R 13/14; G01R 27/08; G01R 27/20; G01R 27/205; G01R 31/00; G01R 31/3275; G01R 31/3277; G01R 27/00; G01R 27/02; G01R 27/025; G01R 27/14; G01R 27/18; G01R 31/3333; H02H 3/24; H02H 7/00; H02H 7/22; H02H 7/222
(Continued)

(56) References Cited

U.S. PATENT DOCUMENTS

| | | | | |
|---|---|---|---|---|
| 4,178,543 A | * | 12/1979 | Wrinn | G01R 31/316 324/421 |
| 2004/0189319 A1 | * | 9/2004 | Stanisic | G01R 31/3272 324/523 |
| 2011/0084715 A1 | * | 4/2011 | Stanisic | G01R 31/3274 324/713 |

FOREIGN PATENT DOCUMENTS

| | | |
|---|---|---|
| JP | 59-114471 A | 7/1984 |
| JP | 2006-011550 A | 1/2006 |
| JP | 2006-082536 A | 3/2006 |

* cited by examiner

*Primary Examiner* — Arleen M Vazquez
*Assistant Examiner* — Steven Yeninas
(74) *Attorney, Agent, or Firm* — Seyfarth Shaw LLP; Brian Michaelis; Christopher Baxter (57) ABSTRACT

An apparatus and method for the measurement of a resistance of a switching contact of an electrical circuit breaker. A first resistance value across the circuit breaker is determined while the circuit breaker is grounded at both sides and the switching contact is closed. Further, a second resistance value across the circuit breaker is determined while the circuit breaker is grounded at both sides and the switching contact is open. The resistance of the closed switching contact is then determined based on the first resistance value and the second resistance value.

12 Claims, 4 Drawing Sheets

(51) Int. Cl.
*G01R 31/333* (2006.01)
*G01R 27/20* (2006.01)

(58) Field of Classification Search
USPC ........ 324/415–424, 525, 76.15, 713; 361/18,
361/42, 45, 46, 78, 87, 90–92, 93.4, 115,
361/435, 634; 340/635, 638, 650, 654,
340/664
See application file for complete search history.

METHOD AND APPARATUS FOR THE MEASUREMENT OF A RESISTANCE OF A SWITCHING CONTACT OF AN ELECTRICAL CIRCUIT BREAKER

CROSS-REFERENCE TO RELATED APPLICATION DATA

The present invention is a divisional of U.S. patent application Ser. No. 13/970,674 filed Aug. 20, 2013, which claims priority to European Patent Application No. 12006040.5, filed Aug. 24, 2012 both of which are incorporated herein by reference in their entirety.

BACKGROUND OF THE INVENTION

The present invention relates to a method and an apparatus for the measurement of a resistance of a switching contact of an electrical power switch (a so-called circuit breaker) as well as a method and an apparatus for the measurement of resistances of switching contacts arranged in a series connection of an electrical circuit breaker. In particular, the present invention relates to a measurement of transition resistances or contact resistances of a closed switching contact or of closed switching contacts of such an electrical circuit breaker.

Power switches, which are also called high voltage switches, load switches or circuit breakers, are used in the field of power engineering or energy technology to establish an electrical connection under load or to disconnect such a connection. The nominal voltages of circuit breakers may be in the range from a few volts to some hundred kilovolts. in the event of a short circuit, the switched load currents may be in the range of some ten kiloamperes. Therefore, for a reliable operation of the circuit breaker, for example the transition resistance of a switching contact or of a plurality of switching contacts connected in series of the electrical circuit breaker are tested in the course of revisions.

Circuit breakers for medium voltage equipment usually have only one switching contact which can be opened or closed. Circuit breakers in high voltage or ultra-high voltage systems can comprise a plurality of switching contacts, so-called interrupter units, in a series connection. In such a series connection of a plurality of interrupter units, generally capacitors dimensioned in the range of some pikofarads are arranged in parallel to the individual interrupter units so as to uniformly distribute the voltage over the individual interrupter units. In general, several interrupter units in a phase of a circuit breaker are opened and closed at the same time.

The resistance measurement at a closed switching contact, which is also referred to as micro-ohm measurement, is for circuit breakers a standard process for the assessment of the quality or the wear condition of the circuit breaker.

The micro-ohm measurement is usually conducted by impressing a high direct current of 100 ampere, for example, over the closed switching contact. For this purpose, the current is supplied via current clamps that are clamped at both sides of the circuit breaker to the conductors that lead away from the circuit breaker. With the aid of further clamps the voltage is tapped at both sides of the circuit breaker as well. The voltage clamps are usually mounted closer to the switching contact of the circuit breaker, a 4-wire measurement being conducted with this arrangement. This prevents that the voltage drop at the current clamps is measured with the measurement, which would falsify the measurement result. The resistance of the closed switching contact, including the resistance of the conductors from the voltage clamps to the switching contact, can be determined from the impressed current and the measured voltage. Alternatively, so-called Kelvin clamps may be used instead of separate current and voltage clamps. In Kelvin clamps, two jaws of a respective clamp are electrically isolated from one another, and the current is supplied via one of the two jaws, while the voltage is tapped via the other of the two jaws. The advantage of such Kelvin claws resides in that only one clamp is to be clamped at each side of the circuit breaker.

As described above, for the micro-ohm measurement a current source and a voltage meter can be used so that voltage measurements can be successively conducted at the different switching contacts. A plurality of voltage meters may be used as well, the current being impressed with the aid of a common current source via several contacts and a plurality of voltage values being determined with the plurality of voltage meters.

As dangerous high voltage can occur at many places in a power engineering installation, for example in a transformer station, it is necessary that the circuit breaker is grounded during the micro-ohm measurement. For example, the circuit breaker can be disconnected at both sides from the remaining energy network and can be grounded at one side. The micro-ohm measurement can then precisely be conducted when the switching contact is closed or when the switching contacts are closed. Often further measurements have to be conducted at the circuit breaker, which require that the switching contact is at least temporarily opened, for example a measurement of the time that takes the switch to open. For such measurements a grounding at both sides of the switch is recommendable to avoid that persons conducting the measurement are exposed to danger. Therefore, for the micro-ohm measurement, one of the two groundings will be removed for the duration of the measurement, which however is very cumbersome, or in the case of a grounding at both sides the micro-ohm measurement becomes inaccurate due to the parallel grounding loop.

In order to be able to efficiently conduct a micro-ohm measurement at a circuit breaker, the circuit breaker may be grounded at both sides, and with a DC-current clamp or a shunt the portion of the current which flows from the current source through the grounding equipment can be determined and can be used to correct the measured resistance. While this method is very precise, it is disadvantageous in that additional measurements are necessary by means of the current clamp or the shunt.

Therefore, it is the object of the present invention to enable an efficient resistance measurement or micro-ohm measurement for one or a plurality of switching contacts of an electrical circuit breaker with exposure of personnel conducting the resistance measurement to danger being avoided.

SUMMARY OF THE INVENTION

According to an embodiment of the present invention, this object is achieved by a method for the measurement of resistances of switching contacts arranged in a series connection of an electrical circuit breaker according to claim 1, and an apparatus for the measurement of resistances of switching contacts arranged in a series connection of an electrical circuit breaker according to claim 10. The dependent claims define preferred or advantageous embodiments of the invention.

According to the present invention, a method for the measurement of a resistance of a switching contact of an electrical circuit breaker is provided. In this method, a first resistance value across the circuit breaker is determined while the circuit breaker is grounded at both sides and the switching contact is closed. Further, a second resistance value across the circuit breaker is determined while the circuit breaker is grounded at both sides and the switching contact is open. The resistance of the closed switching contact is then determined in dependence upon the first resistance value and the second resistance value. The grounding at both sides, for example, can be achieved by two grounding devices or grounding sets that connect ground or earth with the corresponding conductors. Alternatively, the grounding can be achieved with the aid of one grounding device that is connected to ground only once and has several terminals by means of which grounding is possible. The first resistance value, when the switching contact is closed, corresponds to a resistance of the parallel circuit of the closed switching contact and the grounding. The second resistance value corresponds to the grounding resistance. For example, the resistance of the closed switching contact $R_{switch}$ can be determined by the following equation:

$$R_{switch}=(R_2 * R_1)/(R_2 - R_1)$$

$R_1$ is the first resistance value, and $R_2$ is the second resistance value. The measurement can be conducted very precisely as the wiring does not have to be changed between the two measurements.

According to an embodiment of the invention, the first and second resistance values are determined by impressing a direct current in the circuit breaker, which is grounded at both sides, and by measuring a voltage across the circuit breaker. Thus, conventional micro-ohm measurement devices can be used for determining the first and second resistance values.

The circuit breaker can comprise a three-phase switch. At least one switching contact is assigned to each phase. Three-phase switches can comprise a common switching drive or three separate switching drives. In the case of some three-phase switches, it is also possible that single phases can be switched individually, for example in cases where an error occurs at one phase only so that the switch-off of only this one phase is necessary. The method described above can be applied for each phase individually and, therefore, is also suitable for multiple-phase circuit breakers. The method can be conducted simultaneously at two or more phases, thus enabling an efficient test of a multi-phase switch or circuit breaker. According to a further embodiment, the circuit breaker may comprise an ultra-high voltage switch, a high voltage switch, or a medium voltage switch. As the method is independent from the voltage, that is to be switched, of the circuit breaker, it can be used for medium voltage switches having a nominal voltage in the range 1 kV-45 kV, for a high voltage switch having a nominal voltage in the range 45 kV-150 kV, or for an ultra-high voltage switch having a nominal voltage of more than 150 kV, for example.

According to a further embodiment of the invention, an apparatus for the measurement of a resistance of a switching contact of an electrical circuit breaker is provided. The apparatus comprises a control unit for controlling the electrical circuit breaker to selectively open or close the switching contact of the circuit breaker. Further, the apparatus comprises a resistance measurement device that can be coupled with the control unit and the circuit breaker. The resistance measurement device is able to determine a first resistance value across the circuit breaker when the circuit breaker is grounded at both sides and the switching contact of the circuit breaker is closed. Further, the resistance measurement device is able to determine a second resistance value of the circuit breaker when the circuit breaker is grounded at both sides and the switching contact is open. The resistance measurement device determines the resistance of the closed switching contact on the basis of the first resistance value and the second resistance value. Especially when the resistance measurement device is coupled with the control unit for opening and closing the switching contact of the circuit breaker, the resistance measurement can be conducted in a fully automated manner. For example, after the resistance measurement device has been connected to the electrical circuit breaker and the circuit breaker has been grounded at both sides, first the switching contact of the circuit breaker can be closed automatically, then the first resistance value can be measured, and thereafter the second resistance value can be measured after the switching contact has been automatically opened. Finally, the resistance measurement device can determine the resistance of the switching contact in accordance with the above equation and output the resistance.

Furthermore, the apparatus may be configured for carrying out the method and its corresponding embodiments described above and, therefore, also comprises the advantages described above.

According to a further embodiment of the invention, a test environment for the measurement of a resistance of a switching contact of an electrical circuit breaker is provided. The test environment comprises the circuit breaker, a first grounding device, a second grounding device, and a resistance measurement device. The first grounding device can be coupled with a first side of the circuit breaker to ground the first side of the circuit breaker. The second grounding device can be coupled with a second side of the circuit breaker to ground this side. The resistance measurement device can be coupled with both sides of the circuit breaker such that a first resistance value across the circuit breaker can be determined by means of the resistance measurement device when the circuit breaker is grounded at both sides and the switching contact is closed, while a second resistance value across the circuit breaker can be determined when the circuit breaker is grounded at both sides and the switching contact is opened. Further, the resistance of the closed switching contact can be determined with the aid of the resistance measurement device based on the first and second resistance values.

According to another embodiment of the invention, a method for the measurement of resistances of switching contacts of an electrical circuit breaker is provided. The switching contacts of the circuit breaker are arranged in a series connection. In this method, a first measurement current is fed or impressed in a first direction through a first switching contact of the switching contacts arranged in the series connection. Furthermore, a second measurement current is fed or impressed in a second direction through a second switching contact of the switching contacts arranged in the series connection. With respect to the series connection of the switching contacts, the first and second directions of the first and second measurement currents are opposite to one another. The series connection is grounded at both sides, that is, the first and second measurement currents are supplied while the series connection is grounded at both sides. A resistance value of the first switching contact is determined based on the first measurement current while the first and second switching contacts are closed. In other words, the first and second measurement currents are fed in opposite directions in the series connection of the switching contacts. In the case of two switching contacts, for example, the measurement currents can be supplied from a point between the switching contacts to points at both ends of the circuit breaker by means of corresponding current sources. If the first measurement current and the second measurement current are both 100 ampere, for example, a current of 100 ampere thus flows from the center point between both switching contacts in a first direction through the first switching contact, and a further current of 100 ampere flows from this point in the opposite direction through the second switching contact. In the case of symmetrical conditions, i.e., if both closed switching contacts have approximately or exactly the same resistance, substantially the same voltage drop occurs at both switching contacts, the voltage drop at the closed first switching contact having an opposite direction compared to the voltage drop across the closed second switching contact. Thus, substantially no current flows through the groundings that are connected to both sides of the circuit breaker for security reasons, so that there is substantially no voltage drop at the groundings. Thus, the grounding does not affect the measurement of the resistance value of the first switching contact.

According to an embodiment of the invention, a resistance value of the second switching contact can be determined based on the second measurement current when the first and second switching contacts are closed. As substantially no voltage is applied to the grounding loop so that substantially no current flows through the grounding, the resistance of the second switching contact can also be determined with a high accuracy.

If the circuit breaker comprises more than two switching contacts arranged in a series connection, the further switching contacts may be closed during the determination of the resistance values of the first and second switching contacts. As substantially no current flows through the grounding loop, in the case of a circuit breaker, for example, with four switching contacts with only two of the switching contacts being presently measured as described above, all four switching contacts can be closed without affecting the measurement. In this case, the circuit breaker may be grounded at both sides. Thus, the circuit breaker can be switched in its conventional operating modes, i.e., either all switching contacts can be opened or all switching contacts can be closed.

According to a further embodiment, the resistance values of the first and second switching contacts are determined by measuring a first voltage across the first switching contact and a second voltage across the second switching contact. Then, the resistance of the first switching contact can be determined based on the first measurement current and the first voltage. Thus, conventional resistance measurement devices can be used for carrying out the method described above.

According to another embodiment, the first and second measurement currents are adjusted such that a voltage drop across the first switching contact is equal to a voltage drop across the second switching contact. Thereby, the above described symmetry can be established, i.e., it can be ensured that no voltage drop occurs across the grounding loop so that no current flows through the grounding loop. Thereby, the resistances of the first and second switching contacts can be determined with a high accuracy.

Preferably, the first switching contact and the second switching contact are arranged adjacent to one another in the series connection of the switching contacts of the circuit breaker.

According to a further embodiment, the circuit breaker comprises a plurality of pairs of switching contacts. A respective pair of switching contacts comprises the above defined first and second switching contacts that are arranged adjacent to one another. The method described above for the measurement of the resistance of the respective first and second switching contacts is carried out at the same time at a plurality of the pairs of adjacent first and second switching contacts of the circuit breaker. Due to the different current directions in the first and second switching contacts, in particular in the case of the above described symmetrical conditions, a total voltage across each pair of switching contacts is zero. Thus, the pairs of switching contacts do not affect one another during the simultaneous measurement. Furthermore, the voltage across the grounding loop is also zero during a simultaneous measurement at a plurality of pairs of adjacent switching contacts so that the measurement is not affected by the grounding of the circuit breaker. In addition, by means of the both-sided grounding of the circuit breaker, a person conducting the resistance measurement can be protected against unintentional high voltages.

As described above, the circuit breaker can comprise an ultra-high voltage switch, a high voltage switch or a medium voltage switch, for example.

Finally, according to another embodiment of the invention, an apparatus for the measurement of resistances of switching contacts of an electrical circuit breaker is provided. The apparatus comprises a first device for feeding a first measurement current in a first direction through a first switching contact of the switching contacts arranged in the series connection. Furthermore, the apparatus comprises a device for feeding a second measurement current in a second direction through a second switching contact of the switching contacts arranged in the series connection. With respect to the series connection of the switching contacts, the first and second directions of the first and second measurement currents are opposite to one another. The first and second measurement currents are fed in or supplied while the series connection is grounded at both sides. The apparatus further comprises a processing unit that is coupled with the first and second feeding devices and with the circuit breaker. The processing unit is configured to determine a first resistance value of the first switching contact based on the first measurement current while the first and second switching contacts are closed. For example, the processing unit can determine a voltage drop across the first switching contact and can determine the resistance value of the closed first switching contact on the basis of the first measurement current and the voltage drop across the first switching contact. As the first and second measurement currents flow in opposite directions through the series connection of the switching contacts of the circuit breaker, the absolute amount of the voltage drop across the first switching contact and across the second switching contact is the same if the resistances of the first and second switching contacts are substantially the same and the measurement currents are suitably chosen. However, the directions of the voltages are opposite to one another, so that no voltage occurs across the grounding loop formed by the both-sided grounding of the series connection, and thus no current flows through the grounding loop. Thereby, the resistance measurement is not affected by the grounding loop.

DETAILED DESCRIPTION OF THE DRAWINGS

In the following, preferred embodiments of the invention will be described in more detail with reference to the accompanying drawing.

DETAILED DESCRIPTION OF THE INVENTION

Figure 1:
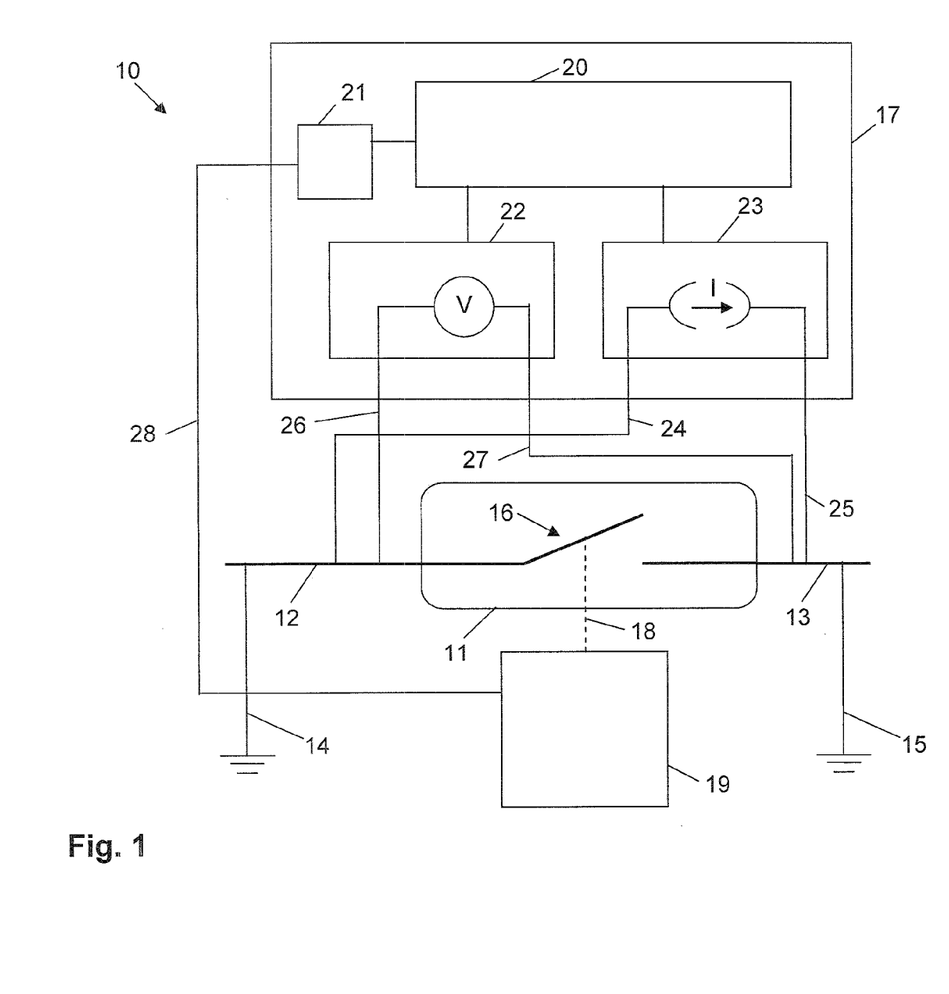
FIG. 1 shows a test environment which comprises an electrical circuit breaker being grounded at both sides and an apparatus for the measurement of a resistance of a switching contact of the circuit breaker according to an embodiment of the present invention.

FIG. 1 shows a test environment 10 with a circuit breaker or power switch 11 which selectively connects or disconnects a first high voltage line 12 and a second high voltage line 13. The test environment 10 further comprises a first grounding device or grounding set 14 coupled with a first side of the circuit breaker 11 and a second grounding device or grounding set 15 coupled with a second side of the circuit breaker 11. The grounding of the circuit breaker 11 at both sides ensures that no dangerous high voltages occur at the circuit breaker 11. The test environment 10 further comprises a micro-ohm measurement apparatus 17 which is coupled with both sides of the circuit breaker 11 via four connections 24-27. The circuit breaker 11 comprises an electrical switching contact 16 that can be selectively opened or closed by a control drive 19 and a mechanical coupling 18 to establish a connection between the lines 12 and 13 or to interrupt the connection. The control drive 19, for example, can be controlled via a control line 28 to open or close the switching contact 16. Furthermore, it is also possible that the control drive 19 is manually controlled or actuated by an operator to selectively open or close the switching contact 16.

The apparatus 17 comprises a resistance measurement device which, for example, comprises a current source 23 and a voltage meter 22. Via the connections 24 and 25, the current source 23 supplies and impresses a current I flowing through the circuit breaker 11 and both grounding devices 14, 15, and the voltage meter 22 detects via the connections 26, 27 a voltage drop V across the circuit breaker 11. The apparatus 17 further comprises a processing unit 20 which determines or calculates a resistance across the circuit breaker 11 on the basis of the current I impressed by the current source 23 and the voltage V measured by the voltage meter 22. In addition, the processing unit 20 is coupled with a control unit 21 of the apparatus 17, the control unit 21 controlling the control drive 19 of the circuit breaker 11 via the connection 28. Thus, the processing unit 20 is able to selectively open or close the switching contact 16. In the following, the functioning and operation of the apparatus 17 will be described.

First, the circuit breaker 11 is grounded at both sides by means of the grounding devices 14 and 15. Then, as shown in FIG. 1, the resistance measurement device 22, 23 is connected to the circuit breaker 11 such that a resistance across the circuit breaker 11 can be measured. Thereafter, two resistance values are determined one after the other. One resistance value $R_1$ is determined when the switching contact 16 is closed, and one resistance value $R_2$ is determined when the switching contact 16 is open. The resistance $R_1$ thus corresponds to a resistance of a parallel circuit of the resistance of the switching contact 16 and the resistance of the grounding loop via the grounding devices 14 and 15, while the resistance $R_2$ only corresponds to the resistance of the grounding loop via the grounding devices 14 and 15. The resistance of the closed switching contact 16 can be calculated from these two resistance values using the equation described above. This is done by the processing unit 20. In addition, the processing unit 20 can selectively open and close the switching contact 16 via the control unit 21, so that the processing unit 20 can conduct both resistance measurements one after the other when the switching contact is open and when the switching contact is closed, respectively, and thereafter calculate the resistance of the closed switching contact 16 therefrom. The order, in which both resistance measurements are conducted, is arbitrary. Alternatively, the processing unit 20 can instruct an operator through a corresponding display to open or close the switching contact 16 manually or by means of a corresponding actuator device if no automatic control via the control unit 21 and the connection 28 is provided. As the circuit breaker 11 is grounded at both sides during the whole measurement, it can be ensured that no dangerous high voltages occur at the circuit breaker 11.

Figure 2:
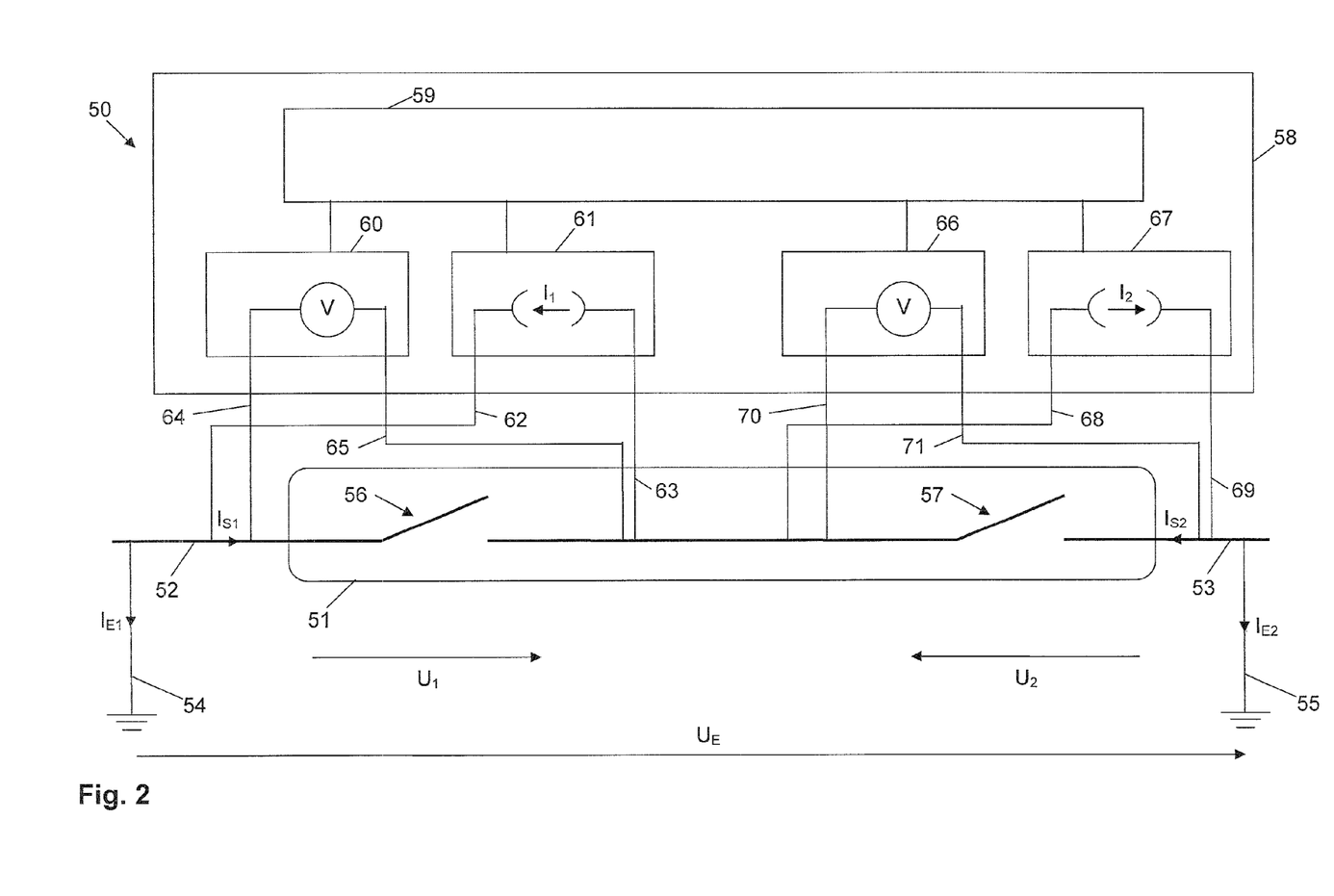
FIGS. 2-4 show test arrangements with an apparatus for the measurement of resistances of switching contacts of an electrical circuit breaker according to further embodiments of the present invention.

FIG. 2 shows a further test environment 50 with a circuit breaker 51 having two switching contacts 56 and 57. The switching contacts 56 and 57 are arranged in a series connection. The circuit breaker 51 can comprise further switching contacts which are arranged in a series connection together with the switching contacts 56 and 57. In general, the switching contacts 56 and 57 and the further switching contacts, if any, are selectively opened or closed at the same time by an actuator (not shown). The circuit breaker 51 is coupled with high voltage lines 52 and 53 which can be selectively connected or disconnected by means of the switching contacts 56, 57. The test environment 50 further comprises two grounding devices or grounding sets 54 and 55 which connect the high voltage lines 52 and 53, respectively, with ground or earth. In addition, the test environment 50 comprises an apparatus 58 for the measurement of the resistances of the switching contacts 56 and 57. The apparatus 58 comprises a first resistance measurement device comprising a voltage meter 60 and a current source 61, and a second resistance measurement device comprising a voltage meter 66 and a current source 67. The first resistance measurement device 60, 61 is connected through connections 62-65 with the first switching contact 56 such that a current $I_1$ of the current source 61 can be impressed via the switching contact 65 when the switching contact 56 is closed. The voltage meter 60 is connected through the connections 64 and 65 with the switching contact 56 such that a voltage drop $U_1$ across the switching contact 56 can be measured. Similar to the first resistance measurement device 60, 61, the second resistance measurement device 66, 67 is coupled with the switching contact 57 through connections 68-71 to impress a current $I_2$ flowing through the closed switching contact 57 and to measure a voltage drop $U_2$ across the switching contact 57. A processing unit 59 is connected with the resistance measurement devices 60, 61 and 66, 67, respectively. The operating principle and functioning of the apparatus 58 will be described in the following.

First, the high voltage lines 52, 53, which are connected to both ends of the circuit breaker 51, are connected with ground or earth via the grounding devices 54, 55. Then, the apparatus is connected to the switching contacts 56 and 57 as described above. Thereafter, the switching contacts are closed. A current $I_1$ is impressed onto the high voltage line 52 by the current source 61. Therefore, the current $I_1$ partly flows as a current $I_{S1}$ from the left to the right through the closed switching contact 56 and partly as a current $I_{E1}$ to ground or earth through the grounding device 54. The current source 67 impresses a current $I_2$ onto the high voltage line 53. The current $I_2$ partly flows as a current $I_{S2}$ from the right to the left through the closed switching contact 57 and partly as a current $I_{E2}$ to ground or earth through the grounding device 55. Due to the transition resistance of the switching contact 56 a voltage drop $U_1$ occurs across the switching contact 56. Likewise, a voltage drop $U_2$ occurs across the switching contact 57 due to the transition resistance of the switching contact 57. As the currents $I_{S1}$ and $I_{S2}$ are supplied in opposite directions, the voltage drops $U_1$ and $U_2$ likewise have opposite directions. If the transition resistances of the switching contacts 56 and 57 are substantially the same and, in addition, the currents $I_1$ and $I_2$ have substantially the same amount, the voltage drops $U_1$ and $U_2$ have the same amount as well. Thereby, the voltage drop $U_E$ across the grounding loop is zero, so that the currents $I_{E1}$ and $I_{E2}$ are both zero as well. In this case, the current $I_{S1}$ through the switching contact 56 corresponds to the current $I_1$, so that the transition resistance of the switching contact 56 can be determined solely in dependence upon the current $I_1$ and the voltage $U_1$ measured by the voltage meter 60. Likewise, the transition resistance of the closed switching contact 57 can be determined solely based on the current $I_2$, which in this case corresponds to the current $I_{S2}$, and the voltage $U_2$ measured by the voltage meter 66. As the switching contacts 56 and 57 in general are identical in configuration and are subject to a similar stress and wear, they generally have the same transition resistance in the closed condition, so that the above described requirements can be fulfilled and for this so-called symmetrical case a simple and precise determination of the transition resistances is possible. The processing unit 59 can determine and output the respective resistance values on the basis of information provided by the resistance measurement devices 60, 61 and 66, 67. In the event that the transition resistances of the switching contacts 56 and 57 are not the same, the processing device 59 can adjust the currents $I_1$ and $I_2$ such that the voltage drops $U_1$ and $U_2$ substantially have the same amount. Thereby, it is achieved that, even in this non-symmetrical case, the voltage $U_E$ across the grounding loop is substantially zero, so that the transition resistance of the individual switching contacts 56 and 57 can be determined on the basis of the current $I_1$ and $I_2$, respectively, and the voltage drop $U_1$ and $U_2$, respectively.

Figure 3:
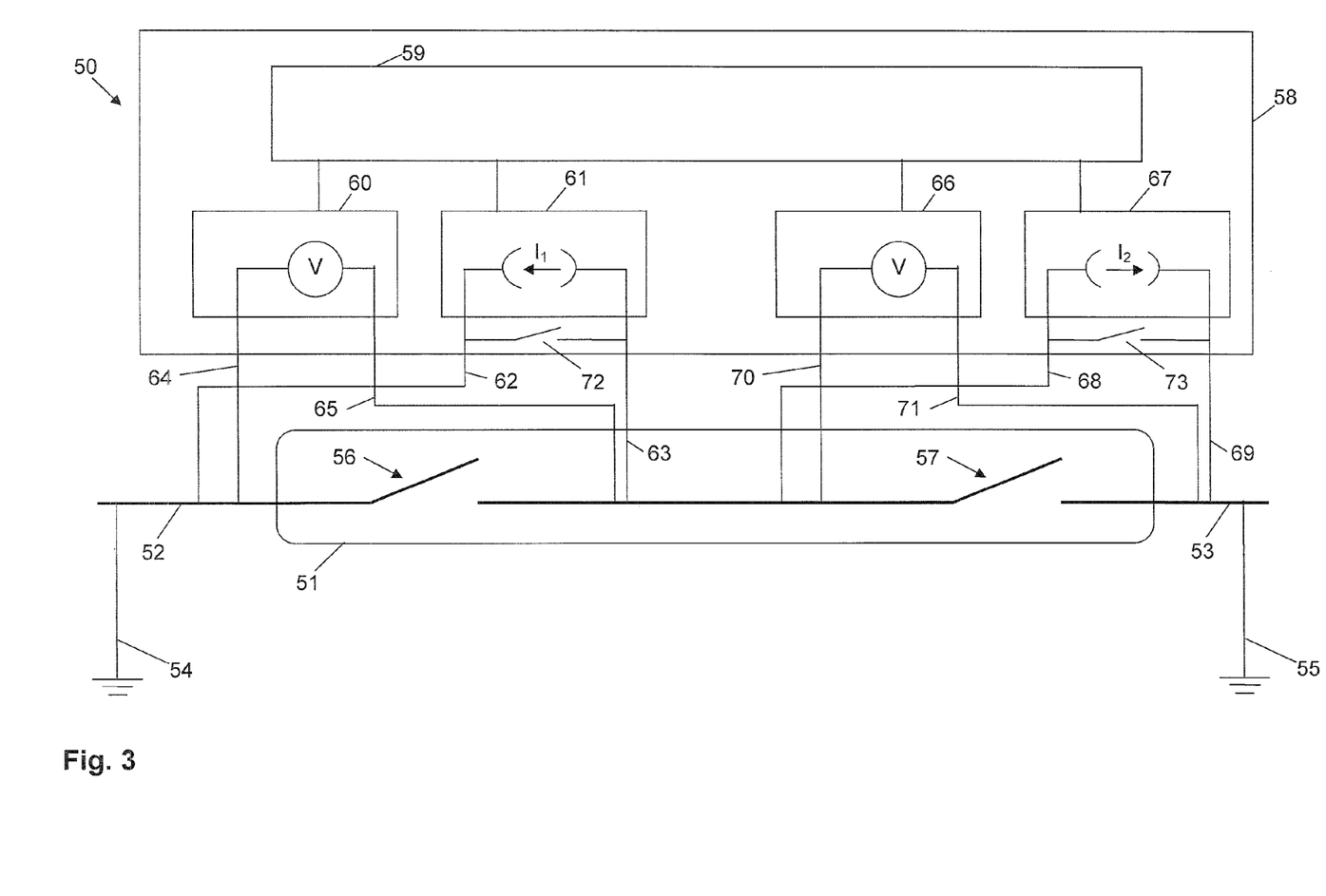

FIG. 3 shows a further test environment 50 which substantially corresponds to the test environment 50 of FIG. 2 and, in addition, comprises two additional switches 72 and 73 arranged in parallel to the switching contacts 56 and 57, respectively. This allows that, even if the switching contacts 56 and 57 are open, a current can be driven through the grounding loop realized by the grounding devices 54 and 55 to be able to determine the resistance of the grounding loop. The resistance of the grounding loop can be used for the correction of resistance values that are determined when the switching contacts 56, 57 are closed. In other words, by means of the switches 72, 73 the method described above in connection with FIG. 1 can be conducted also with the arrangement shown in FIG. 3. For example, the switch 73 can be closed, while the switch 72 can be opened. Then, a micro-ohm measurement of the switching contact 56 can be carried out with the resistance measurement device 60, 61 as described above in connection with FIG. 1. If the switch 72 is closed and the switch 73 is open, a micro-ohm measurement can be carried out at the switching contact 57 with the resistance measurement device 66, 67 as was described above in connection with FIG. 1.

Figure 4:
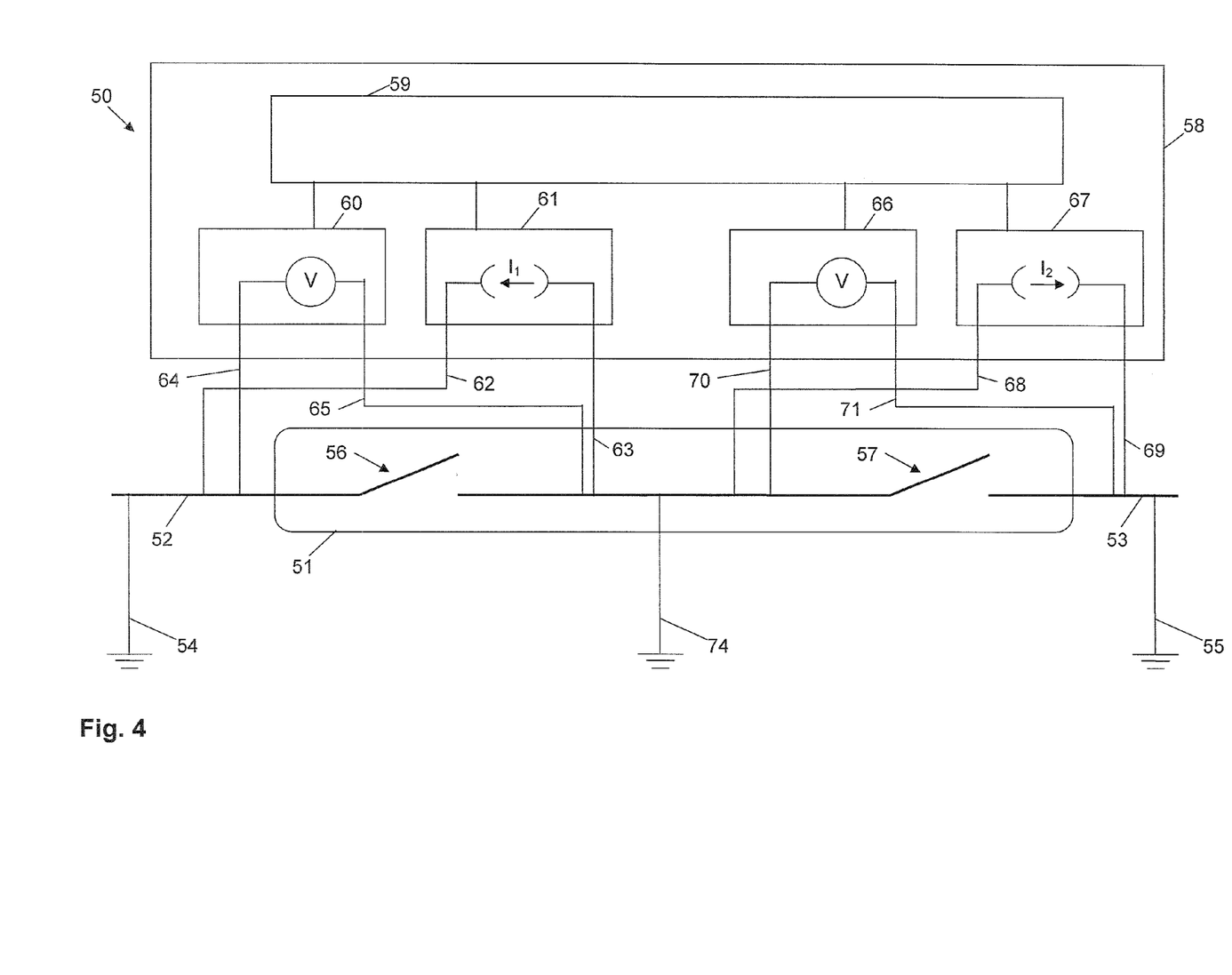

FIG. 4 shows a test environment 50 which substantially corresponds to the test environment 50 of FIG. 2. In addition, the test environment 50 of FIG. 4 comprises a third grounding device 74 which couples a point between the switching contact 56 and the switching contact 57 with ground or earth. In this arrangement, a micro-ohm measurement of the switching contact 56 can be conducted with the aid of the resistance measurement device 60, 61 as was described above in connection with FIG. 1. Furthermore, a micro-ohm measurement of the switching contact 57 can be conducted with the aid of the resistance measurement device 66, 67 as described above in connection with FIG. 1. Both micro-ohm measurements at the switching contacts 56 and 57 can be conducted at the same time. It can be ensured by means of this additional grounding 74 that a high voltage does also not occur between the switching contacts 56 and 57.

What is claimed is:

1. A method for the measurement of resistances of switching contacts arranged in a series connection of an electrical circuit breaker, comprising the steps:
feeding a first measurement current in a first direction through a first switching contact of the switching contacts arranged in the series connection, wherein the first measurement current is fed in a first terminal of the first switching contact and drawn at a second terminal of the first switching contact;
feeding a second measurement current in a second direction through a second switching contact of the switching contacts arranged in the series connection, wherein the second measurement current is fed in a first terminal of the second switching contact and drawn at a second terminal of the second switching contact, the first direction and the second direction being opposite to one another with respect to the series connection of the switching contacts, and the first measurement current and the second measurement current being fed while the series connection is grounded at both sides resulting in a grounding loop;
adjusting the first measurement current and the second measurement current such that a voltage drop across the first switching contact equals a voltage drop across the second switching contact, resulting in a voltage drop across the grounding loop being zero; and
determining a resistance value of the first switching contact on the basis of the first measurement current while the first switching contact and the second switching contact are closed.

2. The method according to claim 1, further comprising the step:
determining a resistance value of the second switching contact based on the second measurement current while the first switching contact and the second switching contact are closed.

3. The method according to claim 2, wherein the circuit breaker comprises more than two switching contacts arranged in a series connection with the first switching contact and the second switching contact, and wherein all the switching contacts of the circuit breaker are closed while the determining of the resistance values of the first and second switching contacts.

4. The method according to claim 2, wherein the determining of the resistance values of the first and second switching contacts comprises:
measuring a first voltage across the first switching contact; and measuring a second voltage across the second switching contact.

5. The method according to claim 1, wherein the first and second measurement currents are fed while the circuit breaker is grounded at both sides.

6. The method according to claim 1, wherein in the series connection the first switching contact is arranged adjacent to the second switching contact.

7. The method according to claim 1, wherein the circuit breaker comprises a plurality of pairs of switching contacts, each of the pairs of switching contacts comprising a first switching contact and an adjacent second switching contact, and wherein the method is simultaneously carried out on several of the pairs of adjacent switching contacts of the circuit breaker.

8. The method according to claim 1, wherein the circuit breaker comprises at least one of an ultra-high voltage switch, a high voltage switch, and a medium voltage switch.

9. An apparatus for the measurement of resistances of switching contacts arranged in a series connection of an electrical circuit breaker, comprising:
   a first device for feeding a first measurement current in a first direction through a first switching contact of the switching contacts arranged in the series connection, wherein the first measurement current is fed in a first terminal of the first switching contact and drawn at a second terminal of the first switching contact;
   a second device for feeding a second measurement current in a second direction through a second switching contact of the switching contacts arranged in the series connection, wherein the second measurement current is fed in a first terminal of the second switching contact and drawn at a second terminal of the second switching contact, the first direction and the second direction being opposite to one another with respect to the series connection of the switching contacts, and the first measurement current and the second measurement current being fed while the series connection is grounded at both sides resulting in a grounding loop; and
   a processing unit coupled to the first device and the second device and configured to determine a resistance value of the first switching contact on the basis of the first measurement current while the first switching contact and the second switching contact are closed, the processing unit also configured to adjust the first measurement current and the second measurement current such that a voltage drop across the first switching contact equals a voltage drop across the second switching contact, resulting in a voltage drop across the grounding loop being zero.

10. The apparatus according to claim 9, wherein a first switch is connected in parallel with the first switching contact and a second switch is connected in parallel with the second switching contact.

11. The apparatus according to claim 9, wherein a first grounding device is connected with the first switching contact and a second grounding device is connected with the second switching contact.

12. The apparatus according to claim 11, wherein a third grounding device is connected with a point between the first switching contact and the second switching contact.

* * * * *